United States Patent
Oshikiri

[19]

[11] Patent Number: 5,848,263
[45] Date of Patent: Dec. 8, 1998

[54] FILE CONVERSION METHOD AND APPARATUS FOR LSI DESIGN DATA

[75] Inventor: Minoru Oshikiri, Hamamatsu, Japan

[73] Assignee: Yamaha Corporation, Hamamatsu, Japan

[21] Appl. No.: 698,167

[22] Filed: Aug. 8, 1996

[30] Foreign Application Priority Data

Aug. 9, 1995 [JP] Japan .................... 7-224782

[51] Int. Cl.$^6$ .................... G06F 17/00
[52] U.S. Cl. .................... 395/500; 364/490; 364/578
[58] Field of Search .................... 364/488, 489, 364/490, 491, 578; 395/500

[56] References Cited

U.S. PATENT DOCUMENTS

| | | | |
|---|---|---|---|
| 5,111,413 | 5/1992 | Lazansky et al. | 364/578 |
| 5,367,468 | 11/1994 | Fukasawa et al. | 364/490 |
| 5,517,421 | 5/1996 | Jimbo et al. | 364/491 |

*Primary Examiner*—Kevin J. Teska
*Assistant Examiner*—A. S. Roberts
*Attorney, Agent, or Firm*—Pillbury Madison & Sutro LLP

[57] ABSTRACT

A file conversion method for LSI design data, which converts LSI design data files described by a first format into source data of a list type structure expressed by lists of cells and nodes, and stores the source data in a memory, and converts the source data of the list type structure stored in the memory into LSI design data files described by a second format. A file conversion apparatus for LSI design data is comprised of multiple input processing portions for changing plural LSI design data files whose description formats are different from each other into source data of a common list type structure expressed by lists of cells and nodes, respectively, and for storing the source data in a memory, multiple output processing portions for changing the source data of the list type structure stored in the memory into plural LSI design data files, a format designation portion for designating an input format and an output format, and an activating portion for activating one of the input processing portions and one of the output processing portions according to the input format and the output format which are designated with the format designation portions, respectively.

4 Claims, 8 Drawing Sheets

```
module ZZZZ ( AB, CDE, FG, MNO );
    input AB, CDE, FG;
  output MNO;
      OR2 PQ ( .IN1(AB), .IN2(CDE), .OUT(HIJ) );
      NOT RST ( .IN(FG), .OUT(KL) );
      AND2 UV ( .IN1(HIJ), .N2(KL), .OUT(MNO) );
endmodule
```

FILE CONVERSION METHOD AND APPARATUS FOR LSI DESIGN DATA

BACKGROUND OF THE INVENTION

1. Field of the Invention

This invention relates to a file conversion method and apparatus for LSI design data which converts LSI design data files described by specific formats into LSI design data files of different formats.

2. Related Art

LSI design is comprised of processes, such as logic design, circuit design, layout design, and mask design. Usually, design data for an LSI to be produced is created with a CAD system and is processed by software (an LSI design tool), such as a logic simulation tool, a circuit-diagram input tool, a timing simulation tool, and an automatic arrangement wiring tool in each process. Generally, these LSI design tools are commercial software, and formats of object data often differ among manufacturers. For this reason, a case where a circuit-diagram input is processed with format A and logic simulation is processed with format B occurs, i.e., the case where the data format of an LSI design tool used with a preprocessing differs from the data format of an LSI design tool used by a subsequent process occurs, and a format conversion is required to proceed the design work continuously.

Generally, EDIF, VHDL, Verilog, Spice, etc., are known as standard formats for this kind of LSI design data. Until now, when performing a format conversion among these formats, conversion programs 81a and 81b are used, respectively, and data files 11 and 12 of each format are once changed into an intermediate file 71 of a specific format as shown in FIG. 12. The format conversion is performed by changing the intermediate file 71 of this specific format into data files 13–15 of other formats using conversion programs 81c–81e, respectively. For example, although conversion programs of $_6C_2=30$ pieces are necessary when all conversions among six kinds of formats A-F are taken into consideration, the number of required conversion programs is reduced to 6×2=12 pieces by converting through a specific format. Therefore, such a specific format is used intermediately.

However, conversion programs of the number corresponding to the number of kinds of formats must be created in the above-mentioned conventional file conversion system of LSI design data, and the respective conversion programs are usually complicated. Therefore, the whole conversion system becomes complicated and causes problems in that the creation and the maintenance thereof take time. Moreover, since a description format which is specified is obtained through an intermediate file in the above-mentioned format conversion, there is a problem in that it takes processing time due to the occurrence of writing to a disk in a stage where an intermediate file is created and reading-out from the disk in a stage where the intermediate file is read out.

SUMMARY OF THE INVENTION

It is an object of this invention to provide a file conversion method and apparatus for LSI design data to simplify a format conversion program and to shorten processing time, and the invention was made in view of such problems.

A file conversion method for LSI design data is provided by this invention, which is a file conversion method of LSI design data, in which LSI design data files are changed as described by a first format into an LSI design data file described by a second format, and has a first step which changes an LSI design data file described by the first format into source data of a list type structure expressed by lists of cells and nodes, and stores the source data in memory, and a second step which changes the source data of the list type structure stored in the memory into an LSI design data file described by the second format.

A file conversion apparatus for LSI design data is also provided by this invention; the apparatus comprises a plurality of input processing portions for changing a plurality of LSI design data files whose description formats are different from each other into source data of a common list type structure expressed by lists of cells and nodes, respectively, and for storing the source data in a memory, a plurality of output processing portions for changing the source data of the list type structure stored in the memory by the input processing portions into a plurality of LSI design data files whose description formats are different from each other, a format designation portion for designating an input format and an output format, and an activating portion for activating one of the input processing portions and one of the output processing portions according to the input format and the output format which are designated with the format designation portions, respectively.

According to the file conversion method for LSI data of this invention, since format conversion is performed through source data of a list type structure expressed by lists of cells and nodes, the conversion can be performed with not only the files of the description form which exclusively utilizes cells, such as Verilog, but also the files of the description form which mainly utilizes nodes, such as EDIF. Therefore, the conversion from each format to the data of a list type structure and the conversion to each format from the data of the list type structure can be easily achieved, and the conversion program can also be simplified. Moreover, since file conversion is carried out through LSI design data of a list type structure stored in a memory, without using an intermediate file, writing and reading-out to/from a disk, which occurs when an intermediate file is used, are not required, and conversion processing time can also be shortened.

According to the file conversion apparatus for LSI data of this invention, since output processing portions to perform processes of conversion to files of specific formats from the source data of a common list type structure are employed to correspond to each output format as well as input processing portions to perform processes of conversion to source data of the common list type structure from files of specific formats are employed to correspond to each input format, conversion processes can correspond to plural input formats and output formats by only activating one of input processing portions and one of output processing portions which are designated, respectively. Since only an addition of an input processing portion and an output processing portion is sufficient for an addition of a new format, extension of a system can be easily attained.

DESCRIPTION OF PREFERRED EMBODIMENT

Hereafter, preferred embodiments of this invention are explained with reference to the drawings.

Figure 1:
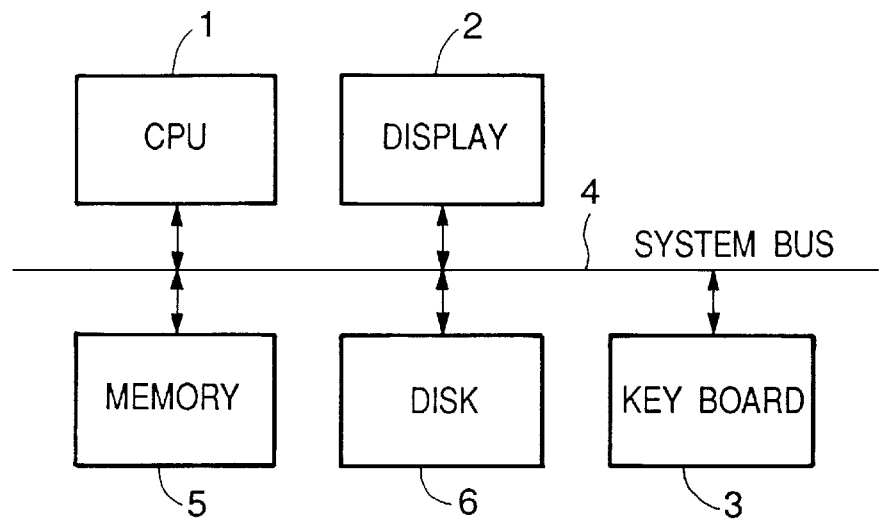
FIG. 1 is a block diagram showing the composition of a CAD system relating to an embodiment of this invention.

FIG. 1 is a block diagram showing the composition of a system which realizes a file conversion apparatus of LSI design data as one preferred embodiment, which is the best mode, of this invention. This system, for example, may be a work station connected to a network (not shown). CPU1 performs LSI design tool operations and conversion programs which are installed, and realize an interactive design system which performs each processing of a logic design, a circuit design, a layout design, a mask design, etc., to LSI design data through a display 2 and a keyboard 3. The LSI design data is stored in a memory 5, such as a RAM, through a system bus 4, as data of a list type structure, in a process of a format conversion, and the LSI design data is saved on a disk 6, such as a magnetic disk, an optical magnetic disk, etc., as the state of a file form.

Figure 2:
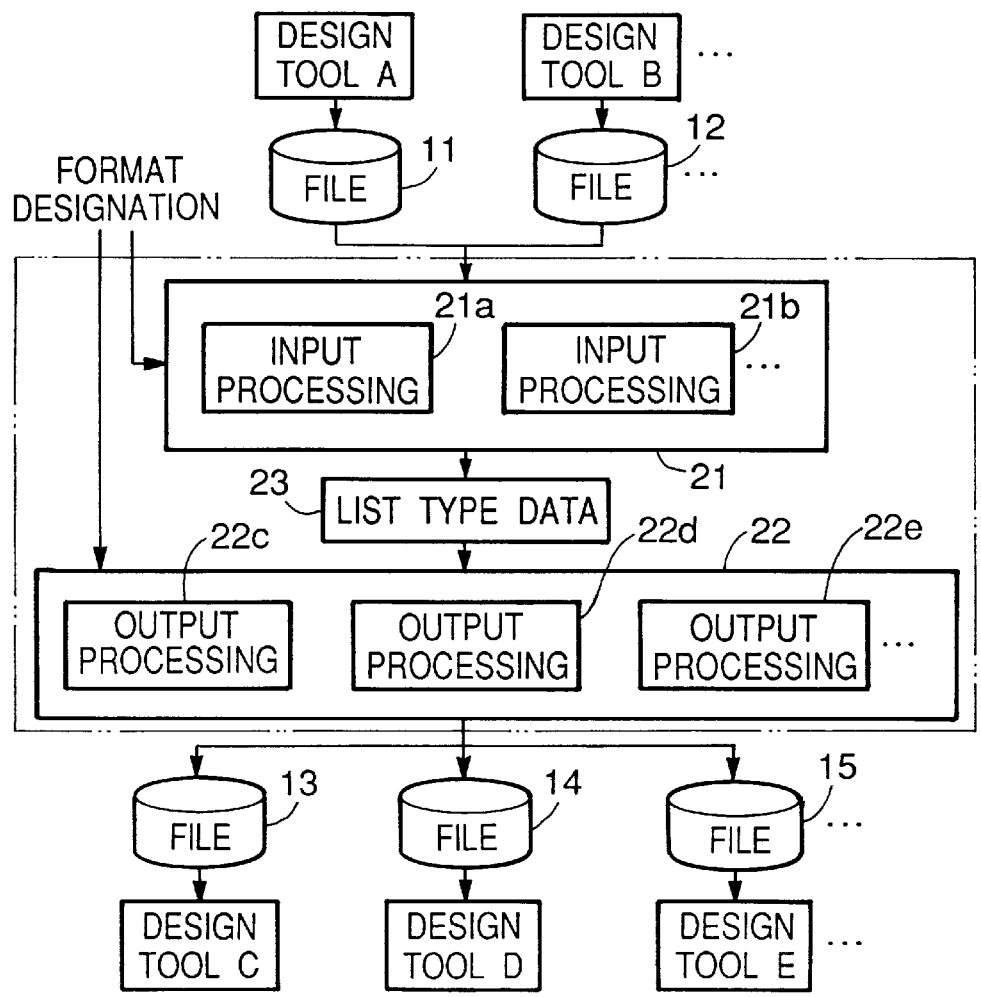
FIG. 2 is a function block diagram showing the composition of a file conversion apparatus of LSI design data in the system shown in FIG. 1.

FIG. 2 is a function block diagram showing the composition of a file conversion apparatus of LSI design data, which is realized by the system in FIG. 1. Here, it is assumed that formats (input formats) of LSI design tools A and B which are used with a preprocessing are formats A and B, and formats (output formats) of LSI design tools C–E which are used by the following processing are formats C–E in a LSI design.

LSI design data created with LSI design tools A and B is written in the disk 6 as files 11 and 12 with the formats A and B as they are, respectively. According to the input formats A and B designated by the format designation portion, which is not illustrated, an input conversion portion 21 activates input processing portions 21a and 21b to read the data of files 11 and 12, and develops it in the memory 5 while changing it into data 23 of a common list type structure. According to the output formats C–E designated in the format designation portion, an output conversion portion 22 activates output processing portions 22c–22e to read the data 23 of the common list type structure, and writes it in the disk 6 as files 13–15 while changing it into the designated description formats C–E. Files 13–15 are read when LSI design tools C–E are to be used afterwards.

Designation of formats may be executed, for example, when a user who operates the CAD system designates the kind of formats through a keyboard 8, or after a function of automatically recognizing the kind of formats of LSI design tools is prepared in the CAD system, designation of formats may be carried out automatically by the CAD system to correspond to the recognized formats.

Next, conversion operation of LSI design data in the CAD system constituted in the FIG. 1 and FIG. 2 is explained.

Figure 3:
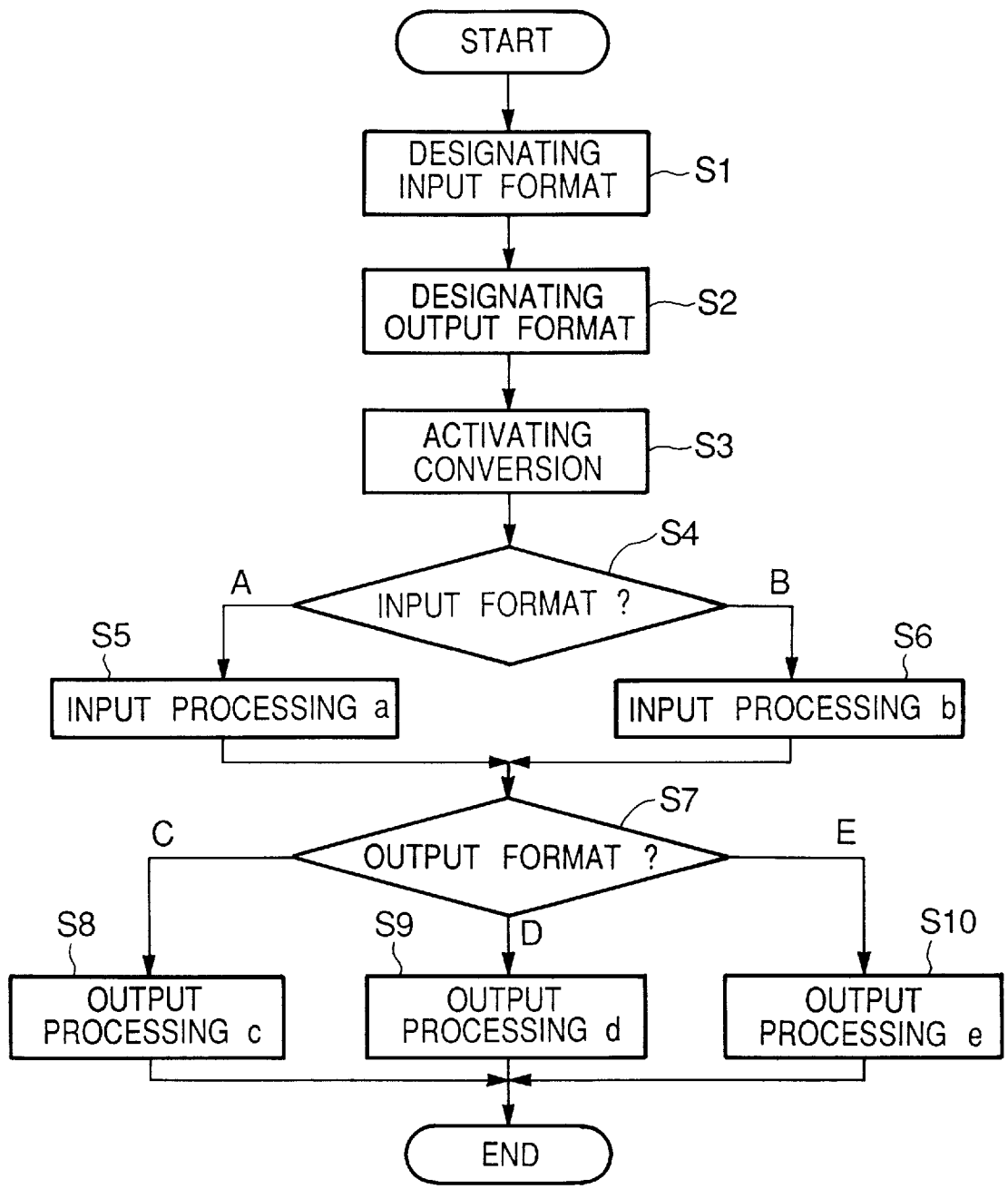
FIG. 3 is a flow chart which shows conversion operation of LSI design data in the embodiment shown in FIG. 2.

FIG. 3 is a flow chart which shows an example of a conversion operation of LSI design data in this embodiment.

First, while designating the kind of input format (SI), the kind of output format is designated (S2), and format conversion is started (S3). Then, corresponding to the designated input format (S4), if it is description format A, the file 11 is changed into list type data 23 by input processing portion 21a (S5), and if it is description format B, the file 12 is changed into list type data 23 by input processing portion 21b (S6). Then, corresponding to the designated output format (S7), if it is description format C, the list type data 23 is changed into the file 13 by output processing portion 22c (S8), and if it is description format D, the list type data 23 is changed into the file 14 by output processing portion 22d (S9), and if it is description format E, the list type data 23 is changed into the file 15 at output processing portion 22e (S10).

Figure 4A:
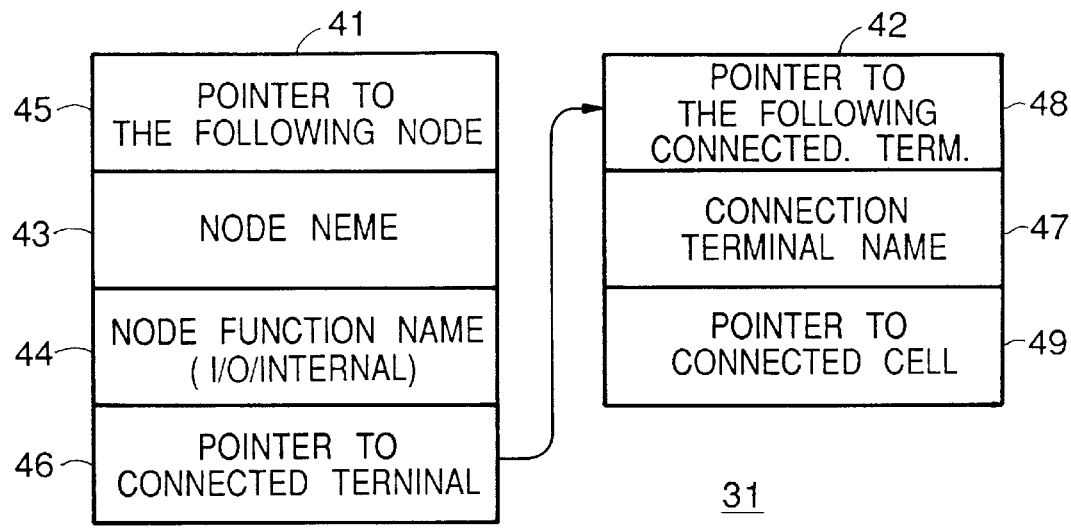
FIGS. 4A–4C are figures for explaining blocks of list type data of this invention.
Figure 4B:
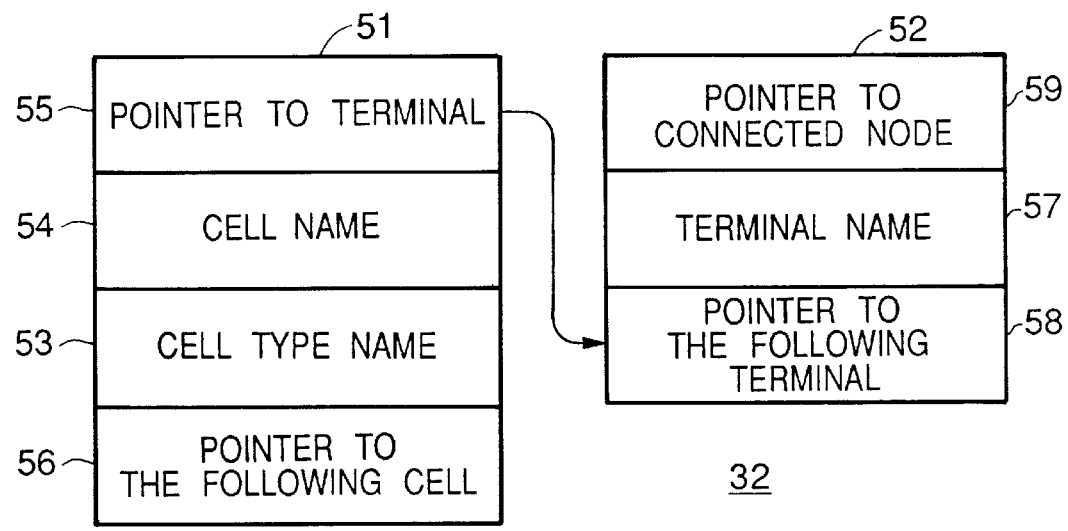
Figure 4C:
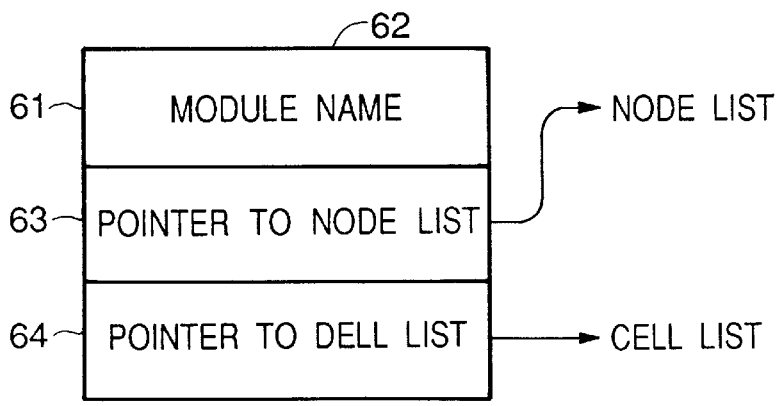

FIGS. 4A–4C are figures for explaining the composition of the list type data according to this invention. This list type data consists of a node list 31 and a cell list 32. The node list 31 consists of blocks 41 indicating each node, and blocks 42 indicating each terminal which is connected to each node, as shown in FIG. 4A. The block 41 consists of data of a node name 43, a node function name 44 which expresses the node is an input terminal, output terminal, or internal node, a pointer 45 indicating the following node, and a pointer 46 indicating a connected terminal therefrom. The block 42 consists of data of a connection terminal name 47, a pointer 48 indicating the following connection terminal, and a pointer 49 indicating a connected cell therefrom. The block 41 and the block 42 are connected through the pointer 46.

On the other hand, the cell list 32 consists of blocks 51 indicating each cell, and blocks 52 indicating the terminals with which each cell is equipped, as shown in FIG. 4B. The block 51 consists of data of a cell name 53, a cell type name 54 indicating the type of the cell, a pointer 56 indicating the following cell, and a pointer 55 indicating a connected terminal therefrom. The block 52 consists of data of a terminal name 57, a pointer 58 indicating the following terminal, and a pointer 59 to a connected node therefrom. The block 51 and the block 52 are connected through the pointer 55.

Similarly, as shown in FIG. 4C, it is possible to express a module by employing a pointer 63 to a node list, and a pointer 64 to a cell list, using a block 62 to which a module name 61 is given.

Next, the details of a conversion processing from the file of a specific input format to the file of a specific output format are explained.

Figures 5, 6:
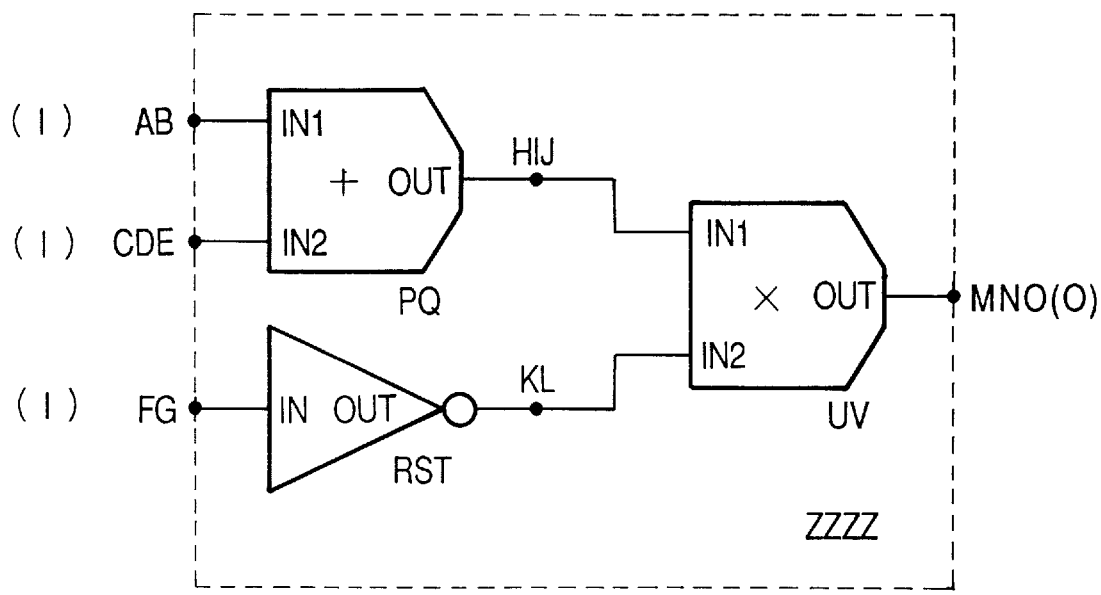
FIG. 5 is a figure showing LSI design data described by a standard format.
FIG. 6 is a logic figure showing an example of LSI design data.

FIG. 5 is a figure showing an example of a file which describes the logic figure shown in FIG. 6 by Verilog format.

The first line means that module ZZZZ has four terminal nodes AB, CDE, FG, and MNO. Next, the description about these terminal nodes continues, and it is described that the terminal nodes AB, CDE, and FG are input nodes (the second line), and the terminal node MNO is an output node (the third line). Furthermore, the description about a cell continues, and it is described that a two-input OR circuit PQ has IN1 terminal connected to the node AB, IN2 terminal connected to the node CDE, and OUT terminal connected to a node HIJ (the fourth line), and it is described that a NOT circuit RST has IN terminal connected to the node FG, and OUT terminal connected to a node KL (the fifth line), and it is described that a two-input AND circuit UV has IN1 terminal connected to the node HIJ, IN2 terminal connected to the node KL, and OUT terminal connected to the node MNO (the sixth line).

What is necessary is merely to perform the following processings for carrying out conversion processing of the file of such an input format into the data of a list type structure as shown in FIGS. 7–11.

Figure 7:
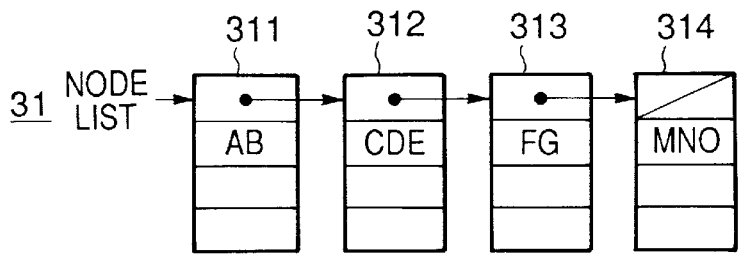
FIG. 7 is a figure for explaining development of a node list according to this invention.
Figure 8:
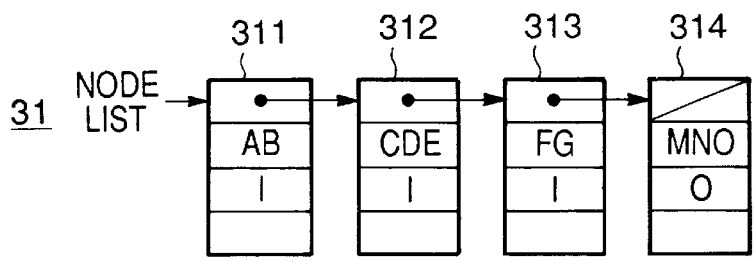
FIG. 8 is a figure for explaining development of a node list according to this invention.
Figure 9:
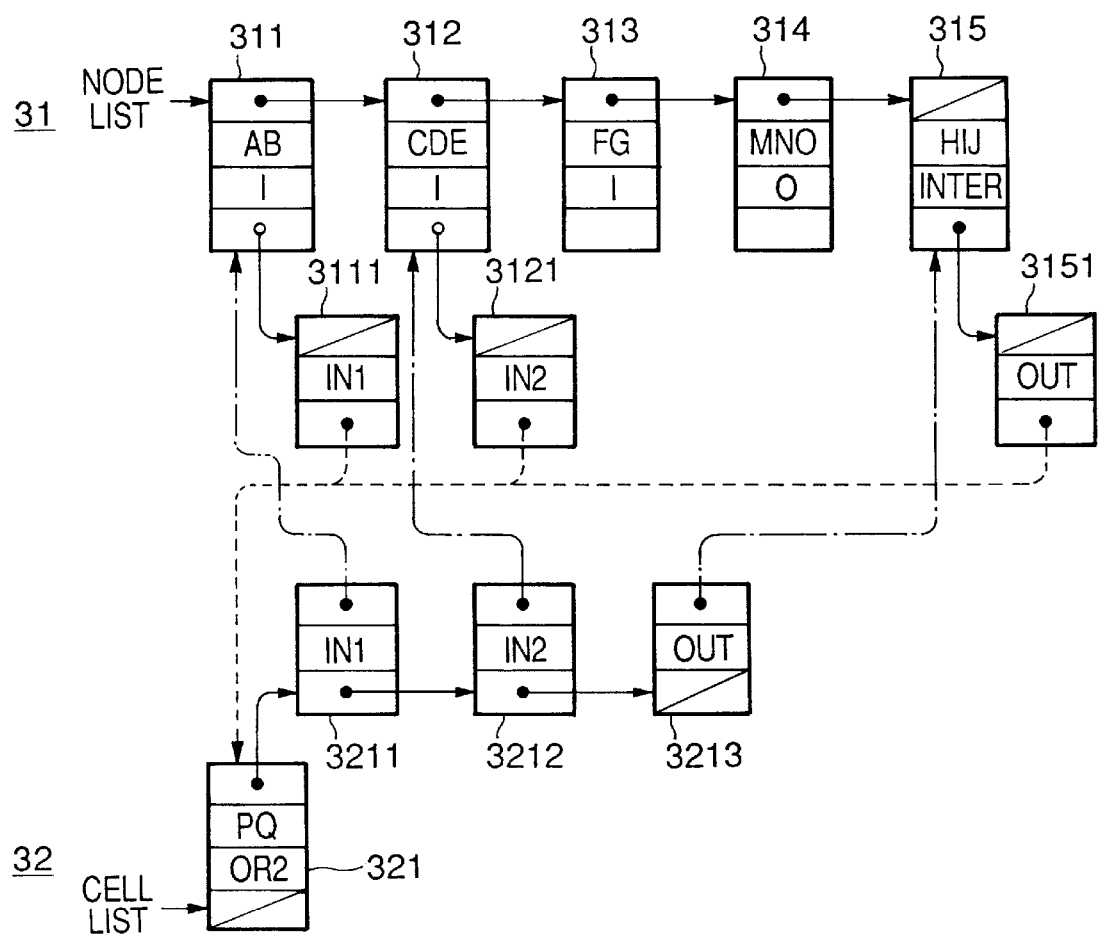
FIG. 9 is a figure for explaining development of a cell list according to this invention.

First, the first line is read, and blocks 311, 312, 313, and 314 corresponding to four terminal nodes AB, CDE, FG, and MNO are developed (i.e., stored) in the memory 5 as a node list 31, as shown in FIG. 7. Since it is recognized that the terminal nodes AB, CDE, and FG are input terminals ("I"), and the terminal node MNO is an output terminal ("O"), when reading the second and third lines, parameters "I" and "O" are set as the node function names of each block of the node list 31 as shown in FIG. 8. Then, the fourth line is read, and, as shown in FIG. 9, a block 321 corresponding to the cell PQ is added to a cell list 32. Since the cell PQ has IN1, IN2, and OUT terminals, the blocks 3211, 3212, and 3213 indicating these terminals are also developed in the lower layer of the block 321 of the cell PQ, respectively. Since IN1 terminal of the cell PQ is connected to the node AB, while setting up the address which specifies that the block AB (311) is connected to the block IN1 (3211), a block 3111 which expresses that the terminal AB is connected to the terminal IN1 is developed in the lower layer of the block AB (321), and the address which specifies the block PQ (321) is set in the block 3111. Since IN2 terminal of the cell PQ is connected to the node CDE, while setting up the address which specifies that the block CDE (312) is connected to the block IN2 (3212) of a lower layer of the block PQ (321), a block 3121 which expresses that the terminal IN2 is connected to the block CDE (312) is developed in the lower layer of the block CDE (312), and the address which specifies that the block PQ (321) is set in the block 3121.

On the other hand, although OUT terminal of the cell PQ is connected to the node HIJ, since the corresponding node HIJ currently does not exist, a block 315 which corresponds to the internal node HIJ is newly added to the node list 31. Furthermore, while setting up the address, which specifies the block HIJ, into the block OUT (3213) of a lower layer of the block PQ (321), a block 3151 which expresses that the terminal OUT is connected to the node HIJ is develped in the lower layer of the block HIJ (315), and the address which specifies the block PQ (321) is set up in the block 3151.

Figure 10:
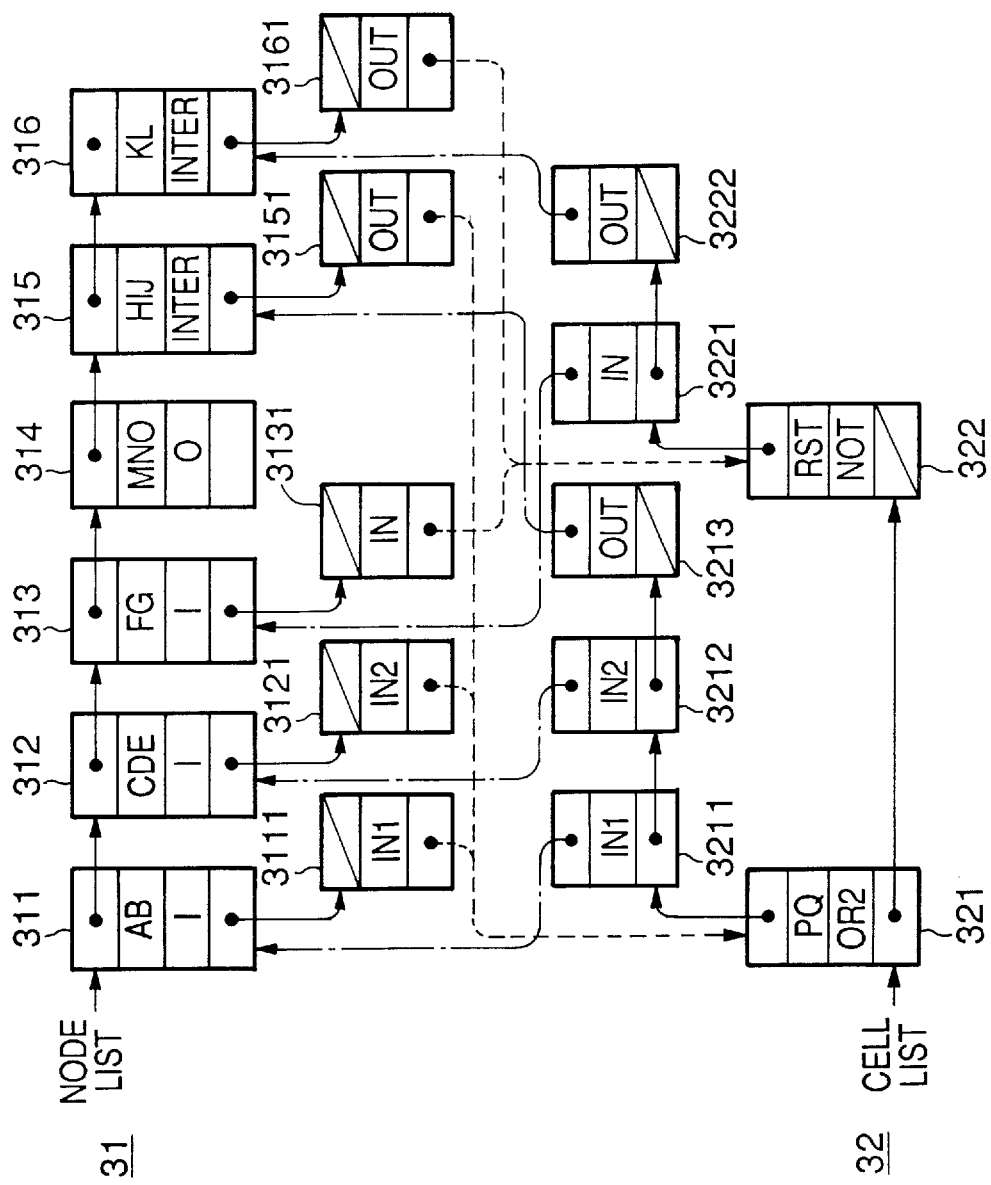
FIG. 10 is a figure for explaining development of a cell list according to this invention.

Then, the fifth line is read. As shown in FIG. 10, while adding a block 322 corresponding to the cell RST to the cell list 32, since this cell RST has IN and OUT terminals, blocks 3221 and 3222 indicating these terminals are developed in the lower layer of the block 322, respectively. Since IN terminal of the cell RST is connected to the node FG, while setting up the address which specifies the block FG (313) in the block IN (3221), a block 3131 which expresses that the terminal IN is connected to the terminal FG is developed in the lower layer of the block FG (313), and the address which specifies the block RST (322) is set in the block 3131. On the other hand, although the OUT terminal of the cell RST is connected to the node KL, since the corresponding node KL currently does not exist, a block 316 which corresponds to the internal node KL is newly added to the node list 31. Furthermore, while setting up the address which specifies the block KL (316) in the block OUT (3222), a block 3161 which expresses that the terminal OUT is connected to the node KL is developed in the lower layer of the block KL (316), and the address which specifies the block RST (322) is set in the block 3161.

Figure 11:
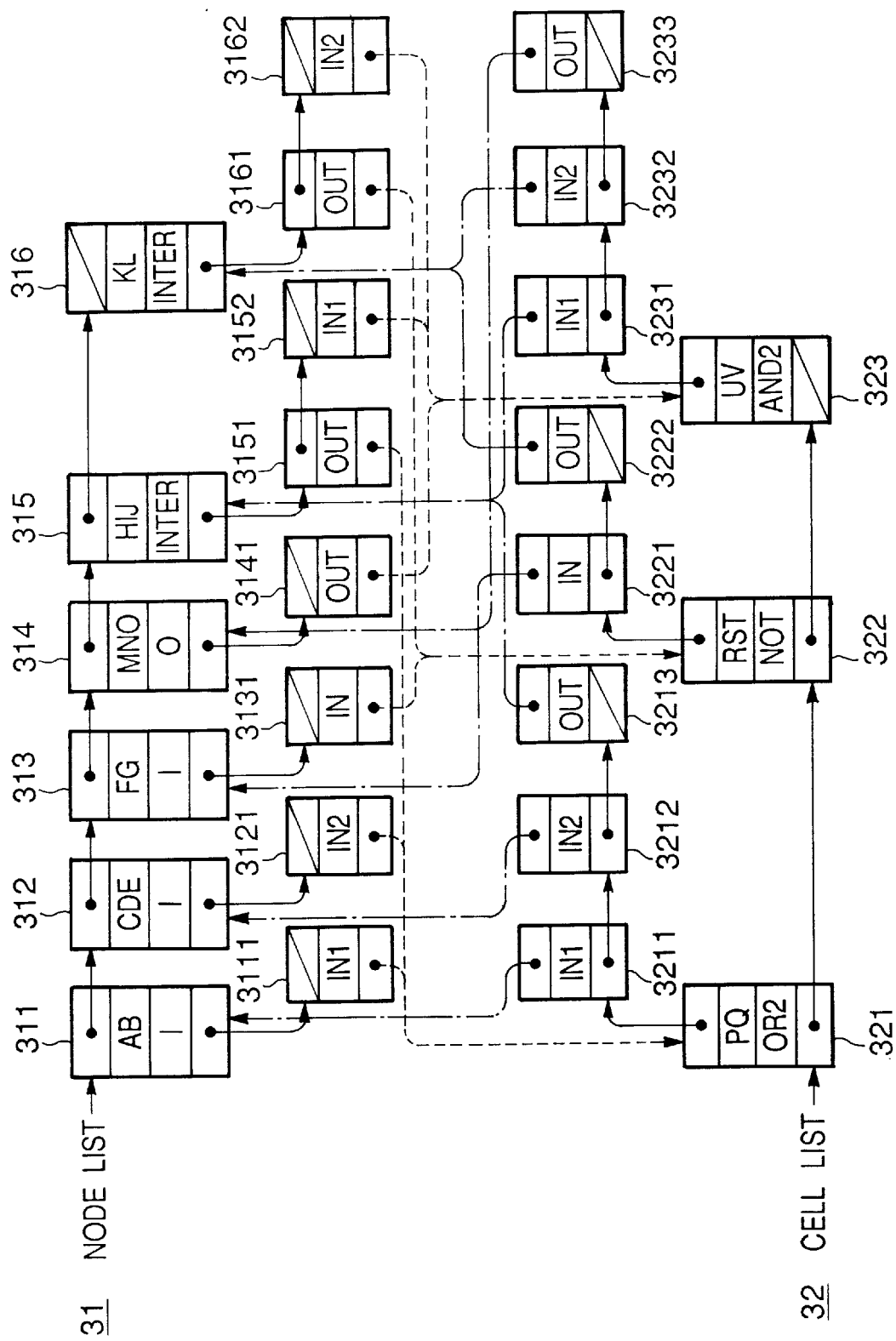
FIG. 11 is a figure showing an example which develops LSI design data with a list type structure according to this invention.
Figure 12:
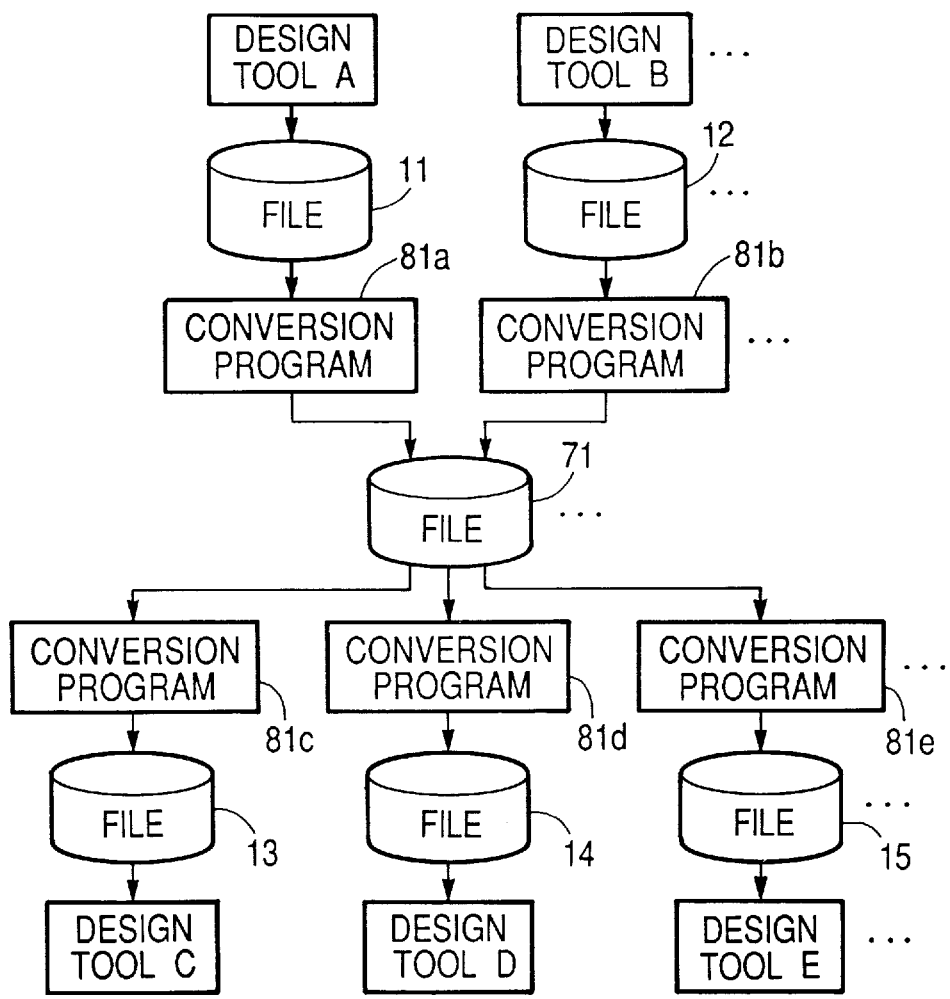
FIG. 12 is a function block diagram showing the composition of a conventional file conversion apparatus of LSI design data.

Then, the sixth line is read. As shown in FIG. 11, while adding a block 323 corresponding to the cell UV to the cell list 32, since this cell UV has IN1, IN2 and OUT terminals, blocks 3231, 3232 and 3233 indicating these terminals are developed in the lower layer of the block 323, respectively. Since IN1 terminal of the cell UV is connected to the node HIJ, while setting up the address which specifies the block HIJ (315) in the block IN1 (3231), a block 3151 which expresses that the terminal IN1 is connected to the terminal HIJ is developed in the lower layer of the block HIJ (315), and the address which specifies the block UV (323) is set in the block 3151. Similarly, since IN2 terminal of the cell UV is connected to the node KL, while setting up the address which specifies the block KL (316) in the block IN2 (3232), a block 3162 which expresses that the terminal IN2 is connected to the terminal KL is developed in the lower layer of the block KL (316), and the address which specifies the block UV (323) is set in the block 3162. On the other hand, since the OUT terminal of the cell UV is connected to the node MNO, while setting up the address which specifies the block MNO (314) in the block OUT (3233), a block 3141 which expresses that the terminal OUT is connected to the node MNO is developed in the lower layer of the block MNO (314), and the address which specifies the block UV (323) is set up in the block 3141.

Consequently, a file of Verilog format as shown in FIG. 5 can be converted to the source data of a list type structure as shown in FIG. 1 1.

Next, a case where an inverting conversion processing to the file in the Verilog format from the data of the list type structure shown in FIG. 11 is explained.

First, it is described that there is a module ZZZZ which has four terminal nodes AB, CDE, FG, and MNO, based on the fact that blocks whose node function name is "I" "O" are terminal nodes, with reference to the node list 31 (the first line). Then, it is described that the terminal nodes AB, CDE, and FG whose node function names are "I" are input nodes (the second line), and it is described that the terminal node MNO whose node function name is "O" is an output node (the third line).

Next, with reference to the cell list 32, it is described that there is a two-input OR circuit PQ with IN1 terminal connected to the node AB, IN2 terminal connected to the node CDE, and OUT terminal connected to a node HIJ (the fourth line), and there is a NOT circuit RST with IN terminal connected to the node FG, and OUT terminal connected to a node KL (the fifth line), and there is a two-input AND circuit UV with IN1 terminal connected to the node HIJ, IN2 terminal connected to the node KL, and OUT terminal connected to the node MNO (the sixth line). As a result, the source data of the list type structure which is shown in FIG. 11 is converted into the Verilog format as shown in FIG. 5.

According to this embodiment, format conversion can be performed with files of any kind of description forms even if the form is exclusively described with cells or is exclusively described with nodes, since the conversion is performed through the source data of the list type structure expressed by the node list 31 and the cell list 32. For this reason, conversion from respective formats A and B to the data of the list type structure and the conversion to respective formats C–E from the data of the list type structure can be easily achieved, and conversion programs can also be simplified. Furthermore, since the file conversion of the files 11 and 12 of specific formats is carried out through LSI design data of the list type structure developed in the memory 5, without using an intermediate file, conversion processing time can also be shortened.

While the input processing portions 21*a* and 21*b*, which perform conversion processing to the source data of the common list type structure from the files 11 and 12 of specific formats, are equipped, correspondingly to respective input formats A and B, the output processing portions 22*c*–22*e*, which perform conversion processing from the source data of the common list type structure to the files 13–15 of specific formats, are equipped, correspondingly to respective output formats C–E. Therefore, conversion processing can be performed with multiple input formats A and B and output formats C–E by activating the input processing portions 21*a* and 21*b* and the output processing portions 22*c*–22*e*, correspondingly to an input format and an output format which are designated, respectively. Since only an addition of an input processing portion or an output processing portion is sufficient for an addition of a new format, extension of a system is easily accomplished.

Although an array type structure, which is different from the list type structure, where the same number of terminals should be secured to all cells and modules can also be considered as a structure of data developed in a memory, since the number of terminals for all the cells and modules should be equal to the maximum number of terminals among all cells and modules, in simple cells, such as an inverter, AND, OR, etc., unused memory area is generated, and there is a problem in that memory use efficiency is low. This kind of problem becomes progressively significant as the scale of LSI to be designed becomes larger. In this point, by using the list type structure by this invention, since what is necessary is to connect each cell and each module with pointers only being equal to the required number of terminals, no excessive memory area is generated, and there is an advantage in that it is suitable for efficiently storing large-scale LSI design data in a memory.

What is claimed is:

1. A method for converting an LSI design data file in a first format into an LSI design data file in a second format, the method comprising:

converting the LSI design data file in the first format into source data of a list type structure expressed by a list of cells and a list of nodes, the list of nodes representing node elements each of which is representative of a plurality of terminals at an associated node, the list of cells representing cell elements, each of which is representative of a circuit function and terminals of an associated circuit element, the terminals of the nodes being logically associated with the terminals of the circuit elements;

storing the source data in a memory; and converting the source data stored in the memory into the LSI design data file in the second format.

2. The method according to claim 1, wherein the step of converting the LSI design data further includes creating the list of cells and nodes with a plurality of blocks having a plurality of layers.

3. The method according to claim 2, wherein the step of converting the LSI design data further includes associating said blocks having a plurality of layers with different blocks by pointers.

4. An apparatus for converting LSI design data, the apparatus comprising:

a plurality of input processors for converting a plurality of first LSI design data files having distinct description formats into source data including a common list type structure expressed by a list of cells and a list of nodes, the list of nodes representing node elements each of which is representative of a plurality of terminals at an associated node, the list of cells representing cell elements each of which is representative of a circuit function and terminals of an associated circuit element, the terminals of the nodes being logically associated with the terminals of the circuit elements;

a memory coupled to the input processors for storing the source data;

a plurality of output processors for converting the source data stored in the memory to a plurality of second LSI design data files whose description formats are different from each other;

a format designation means for designating an output format; and an activating means for activating one of the input processors and one of the output processors according to the input format and the output format which are designated with the format designation means.

* * * * *